United States Patent [19]
Morita et al.

[11] Patent Number: 5,815,366
[45] Date of Patent: Sep. 29, 1998

[54] ELECTROSTATIC CHUCK AND THE METHOD OF OPERATING THE SAME

[75] Inventors: Yoshihisa Morita, Yokohama; Nobuo Okumura, Ikoma; Toshio Nakanishi, Takarazuka, all of Japan

[73] Assignee: Sumitomo Metal Industries, Ltd., Osaka, Japan

[21] Appl. No.: 575,864

[22] Filed: Dec. 20, 1995

[30] Foreign Application Priority Data

Dec. 28, 1994 [JP] Japan .................................. 6-327150
Jul. 19, 1995 [JP] Japan .................................. 7-182836

[51] Int. Cl.⁶ .................................................. H02N 13/00
[52] U.S. Cl. ............................................ 361/234; 279/128
[58] Field of Search .................................. 361/234, 230, 361/233; 269/8, 903; 279/128

[56] References Cited

U.S. PATENT DOCUMENTS

| 5,179,498 | 1/1993 | Hongoh et al. | 361/234 |
| 5,310,453 | 5/1994 | Fukusawa et al. | 156/643 |
| 5,382,311 | 1/1995 | Ishikawa et al. | 156/345 |
| 5,459,632 | 10/1995 | Birang et al. | 361/234 |

FOREIGN PATENT DOCUMENTS

| 60-121970 | 6/1985 | Japan . |
| 4-253356 | 9/1992 | Japan . |
| 5-129421 | 5/1993 | Japan . |
| 5-226292 | 9/1993 | Japan . |
| 6-326180 | 7/1994 | Japan . |
| 6-252253 | 9/1994 | Japan . |
| 3-155647 | 11/1994 | Japan . |
| 6-326180 | 11/1994 | Japan . |

Primary Examiner—Fritz Fleming

[57] ABSTRACT

An electrostatic chuck, which includes a plurality of ejector pins, means of moving up and down the ejector pins and means of grounding the ejector pins, is provided with an ejector buffer mechanism disposed between the ejector pins and the ejector pin moving means for exerting a buffer action for the tip positions of individual ejector pins. The electrostatic chuck facilitates the positioning control of the ejector pins and enables the ejector pins to come in tight contact with the wafer rear surface, and consequently the wafer can be clamped and released quickly and reliably. At the plasma processing of wafer, the ejector pins are brought to tight contact with the wafer rear surface, or a clearance within a prescribed range is created for the ejector pins from the wafer rear surface, thereby suppressing the occurrence of discharge in the gap between an ejector pin and the wafer rear surface, and consequently problems associated with the discharge can be dissolved.

9 Claims, 5 Drawing Sheets

PRIOR ART

ELECTROSTATIC CHUCK AND THE METHOD OF OPERATING THE SAME

BACKGROUND OF THE INVENTION

1. Field of the Invention

The present invention relates to an electrostatic chuck used to clamp a workpiece such as a semiconductor wafer, and particularly to an electrostatic chuck used for the sample stage of a plasma processing apparatus.

2. Description of the Prior Art

Electrostatic chucks are used for sample stages of etching apparatus and CVD apparatus for clamping workpieces such as semiconductor wafers.

The so-called monopolar chuck is made up of an electrode, a dielectric film which covers the clamping surface of a workpiece so as to insulate the workpiece from the electrode, and means of applying a DC voltage between the workpiece and the electrode. The electrostatic chuck of this type operates to apply a DC voltage between the electrode and workpiece interposed by the dielectric film so as to generate a static charge, thereby clamping the workpiece based on the Coulomb force exerting between these members.

There have been proposed methods of supplying a charge to and eliminating a accumulated charge from the workpiece by electrically grounding it through ejector pins. For example, Japanese Patent Application Laid-open No. 4-253356 describes a method of eliminating a accumulated charge from the wafer by grounding it when it is released. Japanese Patent Application Laid-open No. 5-226292 describes a method of supplying a charge to the wafer by grounding it when it is clamped and eliminating a accumulated charge from the wafer by grounding it when it is released.

Figure 1:
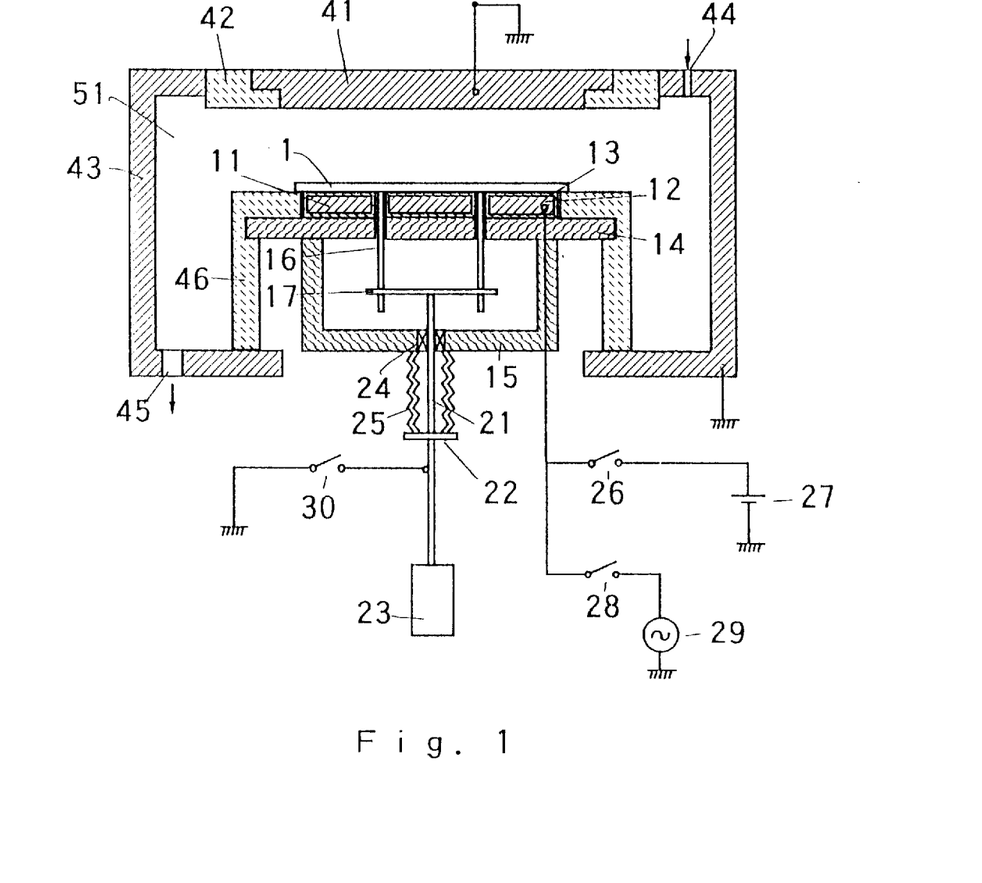
FIG. 1 is a longitudinal cross-sectional diagram showing a plasma processing apparatus equipped with the conventional electrostatic chuck.

FIG. 1 is a longitudinal cross-sectional diagram of a plasma processing apparatus equipped with an electrostatic chuck which supplies a charge to and eliminates a accumulated charge from the workpiece through ejector pins. The electrostatic chuck 11 includes an electrode 12 of aluminum (Al) or the like which is coated with a dielectric film 13 of alumina ($Al_2O_3$), and it is disposed on a base 14. The electrode 12 is connected to a DC power source 27, which applies a DC voltage to the electrode 12, by way of a switch 26. A filter (not shown) for protecting the DC power source 27 is connected between the switch 26 and the DC power source 27. The electrode 12 has in it a liquid circulation path (not shown), and the temperature of the wafer 1 can be controlled by the conduction of heat.

The electrostatic chuck 11 and the base 14 have four apertures (only two apertures are shown in FIG. 1) penetrating from the upper surface of the electrostatic chuck 11 to the bottom surface of the base 14 so that ejector pins 16 can run through. The four ejector pins 16 are coupled by means of an ejector pin coupling plate 17 to a drive shaft 21 which runs through a aperture in the bottom plate 15 of the frame. The drive shaft 21 is connected to an air cylinder 23, and the ejector pins 16 are moved up and down by the operation of the air cylinder 23.

A slide guide 24 is provided around the drive shaft 21 in the aperture of the bottom plate 15, a bellows 25 is provided to surround the part of the drive shaft 21 between the bottom plate 15 and a seal plate 22, and a reaction chamber 51 is sealed airtightly. The ejector pins 16, coupling plate 17 and drive shaft 21 are made of metal such as stainless steel (JIS-SUS316) or the like, and the ejector pins 16 can be grounded by way of the coupling plate 17, drive shaft 21 and a switch 30.

The electrode 12 which also works as a lower electrode is connected to a high-frequency (RF) power source 29 by way of a switch 28. A capacitor (not shown) for blocking a DC current and an impedance matching device (not shown) are connected between the switch 28 and the RF power source 29. The electrostatic chuck 11 has its peripheral section protected by a shielding member 46 of alumina or the like.

Disposed over the electrostatic chuck 11 is an upper electrode 41, and its peripheral section is protected by a shielding member 42. The upper electrode 41 is grounded. The upper electrode 41 is made of aluminum or the like, and the shielding member 42 is made of insulator such as alumina. The reaction chamber 51 has its wall 43 made of metal such as aluminum, and it is grounded. Processing gas is introduced into the reaction chamber 51 through a gas inlet 44, and the gas is evacuated by an evacuation pump (not shown) through a gas outlet 45.

Next, plasma processing for a wafer 1 by operating this plasma processing apparatus will be explained. The wafer 1 is moved to the position over the electrostatic chuck 11 by means of a transfer arm (not shown). The ejector pins 16, which are grounded in advance by turning on the switch 30, are moved up to lift the wafer 1, and thereafter the transfer arm retreats.

The switch 26 is turned on to apply the DC voltage to the electrode 12, and the ejector pins 16 are moved down, thereby placing the wafer 1 on the electrostatic chuck 11. A charge is supplied to the wafer 1 through the ejector pins 16, and it is clamped to the electrostatic chuck 11 by the Coulomb force.

Processing gas is introduced into the reaction chamber 51. The ejector pins 16 are further moved down to make a sufficient clearance from the rear surface of the wafer 1, and the switch 30 is turned off so that the ejector pins 16 are disconnected from the ground. The switch 28 is turned on to apply the RF power from the RF power source 29 to the lower electrode 12. Consequently, plasma is generated in the reaction chamber 51, and the wafer 1 is processed by the plasma. After finishing the intended plasma processing, RF power application is stopped.

For releasing the wafer 1, the switch 26 is turned off to stop the DC voltage application to the electrode 12, and the switch 30 is turned on to ground the wafer 1 through the ejector pins 16. The accumulated charge of the wafer 1 is eliminated and the clamping force between the wafer 1 and the electrostatic chuck 11 diminishes. The ejector pins 16 are moved up to lift the wafer 1 off the electrostatic chuck 11, and it is taken out of the reaction chamber 51 by the transfer arm (not shown).

Accordingly, in order to clamp and release a wafer quickly and reliably, it is necessary for the electrostatic chuck arranged as explained above to have its ejector pins brought to tight contact with the rear surface of the wafer while it is placed on the electrostatic chuck so that a charge is surely supplied to the wafer for clamping and surely eliminated from the wafer for releasing.

However, there have been difficult problems of the precise positioning control of ejector pins so that all pins come in contact with the wafer rear surface and of the elimination of disparity of tip positions among all ejector pins. It takes extended times for clamping and releasing a wafer, particularly for eliminating the accumulated charge from the wafer at releasing, if all ejector pins do not come in contact with the wafer rear surface tightly.

Occasionally, A discharge occurs in the gap between an ejector pin and the wafer rear surface, even in case the pins are disconnected from the ground, during the plasma processing of the wafer. This discharge induces problems: (1) The wafer heats up locally; (2) The dielectric film of the electrostatic chuck damages; (3) An insulating substance deposits on the tips of the ejector pins, deteriorating the conductivity of the ejector pins, resulting in extended wafer clamping and releasing times.

SUMMARY OF THE INVENTION

The present invention is intended to overcome the foregoing prior art deficiencies, and its object is to provide an electrostatic chuck capable of bringing the ejector pins to tight contact with the wafer rear surface so that the wafer can be clamped and released quickly.

Another object of the present invention is to provide methods of operating the electrostatic chuck for preventing the discharge in the gap between an ejector pin and the wafer rear surface during the plasma processing of wafer, thereby dissolving the above-mentioned problems associated with the discharge.

In order to achieve the first object, the electrostatic chuck of this invention includes an ejector buffer mechanism, such as springs, for ejector pins so that the ejector pins are brought to tight contact with the wafer rear surface. The ejector buffer mechanism is designed to offset the disparity of clearance of individual ejector pins from the wafer rear surface. Consequently, all ejector pins can be brought to tight contact with the rear surface of the wafer by controlling the position of the ejector pins within a certain range of accuracy. The ejector buffer mechanism eliminates the need of a high-precision control mechanism for the ejector drive means, while enabling the quick and reliable clamping and releasing of a wafer.

In regard to the second object, this invention provides two methods of operating the electrostatic chuck for the plasma processing of a wafer. The first method is to disconnect all ejector pins from the ground and keep the pins in contact with the wafer rear surface so that the wafer and ejector pins have the same potential. Consequently, discharge which would occur in the gap between these members is prevented, and the problems associated with this discharge are dissolved.

However, the inventors of the present invention found the fact that when the ejector pins are kept in contact with the wafer rear surface during the plasma processing, in wiring process for example, charge-up damage is occasionally induced in the insulating film on the wafer. The presumed cause of this charge-up damage is that the ejector pins work as load resistors and load capacitors to vary the potential distribution on the surface of the wafer, and positive ions in the plasma gather to the contact points of the ejector pins on the wafer, causing positive charges to increase at these positions. It was confirmed that the charge-up damage can be suppressed by separating the ejector pins off the wafer rear surface during the plasma processing.

The inventors further studied to prevent the discharge in the gap between an ejector pin and the wafer rear surface, while suppressing the charge-up damage by letting the ejector pins be in non-contact with the wafer rear surface, and found that the discharge occurs dependent on the amount of clearance of the ejector pins from wafer rear surface and that the discharge can be suppressed by making the clearance small enough.

Accordingly, the second method of operation is to disconnect all ejector pins from the ground during the plasma processing of wafer and control the clearance between the ejector pins and wafer rear surface within a certain range of length in which the discharge does not occur. Consequently, the discharge in the gap between an ejector pin and the wafer rear surface can be suppressed and, at the same time, the charge-up damage induced in the insulating film of the wafer during the plasma processing for wiring process or the like can be prevented.

These and other features and advantages of the present invention will be better understood from the following detailed description taken in conjunction with the accompanying drawings.

DETAILED DESCRIPTION

Specific embodiments of the present invention will be explained with reference to the drawings. First, the ejector buffer mechanism of the inventive electrostatic chuck will be explained.

Figure 2:
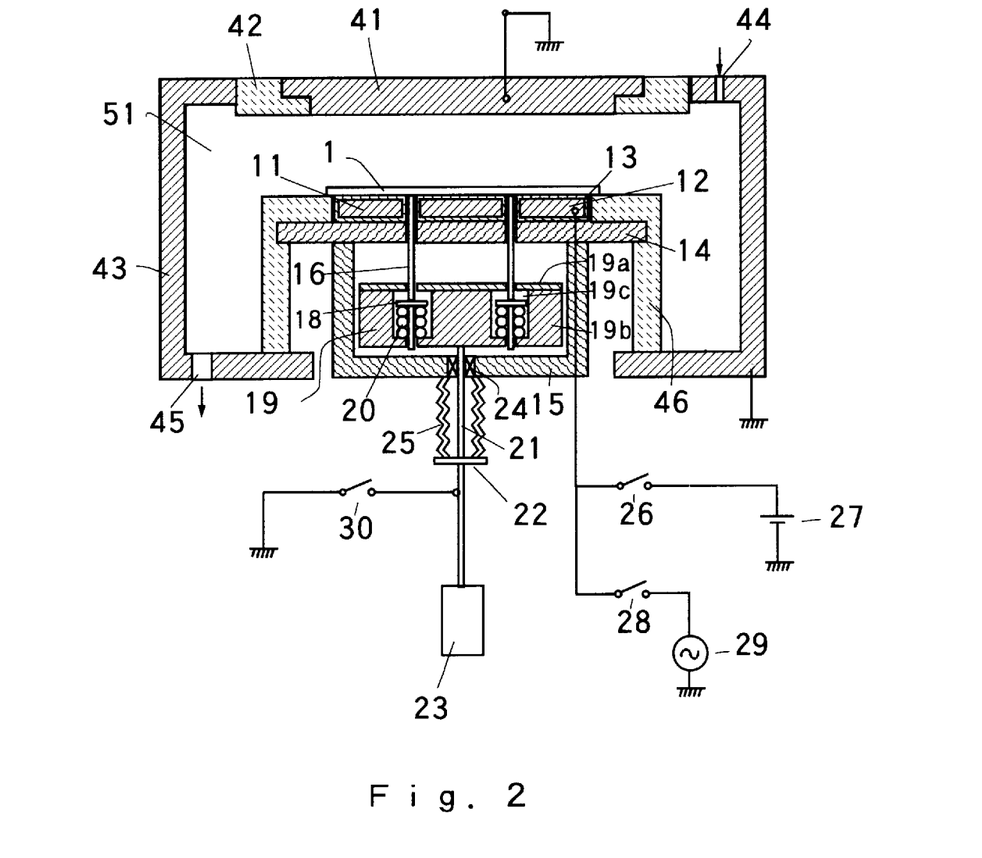
FIG. 2 is a longitudinal cross-sectional diagram showing a plasma processing apparatus equipped with the electrostatic chuck based on this invention.

FIG. 2 shows a plasma processing apparatus equipped with the electrostatic chuck based on an embodiment, and the following explains only portions different from the apparatus with the conventional electrostatic chuck shown in FIG. 1.

In the conventional electrostatic chuck, the ejector pins 16 are coupled to the drive shaft 21 through the ejector pin coupling plate 17, whereas electrostatic chuck of this embodiment is designed to couple the ejector pins 16 to the drive shaft 21 through an ejector buffer mechanism which is made up of an ejector pin housing 19 and springs 20 seated in it.

The ejector pin housing 19 consists of a housing base 19b of stainless steel (JIS-SUS316), with bores 19c for seating the springs 20 being formed therein, and a housing top 19a made of polyimide. The ejector pins 16 are fixed to individual pin flanges 18, which are connected to the ejector pin housing 19 through the individual springs 20 seated in the bores 19c. The spring action of the springs 20 moderates the vertical movement of the individual ejector pins 16 caused by the vertical movement of the drive shaft 21. The springs 20 used in this embodiment are coil springs made of stainless steel.

The ejector pins 16 are grounded by way of the pin flanges 18, springs 20, housing base 19b and drive shaft 21 when the switch 30 is turned on. The coil springs used for the ejector buffer mechanism of this embodiment may obviously be replaced with leaf springs or air cushion devices and so on.

Next, a method of bringing the ejector pins to tight contact with the wafer rear surface at clamping and releasing of a wafer and a method of bringing the ejector pins to tight contact with the wafer rear surface during the plasma processing (the first method of operation of the electrostatic chuck during the plasma processing mentioned previously) will be explained with reference to FIG. 2 and FIGS. 3A–3C.

Figure 3A:
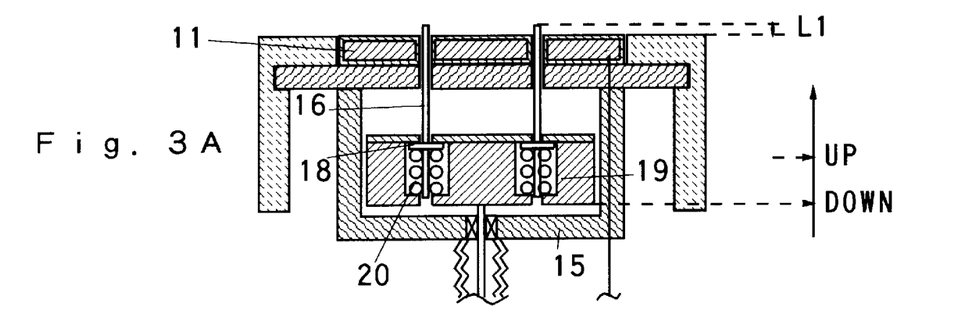
FIGS. 3A,3B and 3C are longitudinal cross-sectional diagrams used to explain a method of operation of the electrostatic chuck of this invention.
Figure 3B:
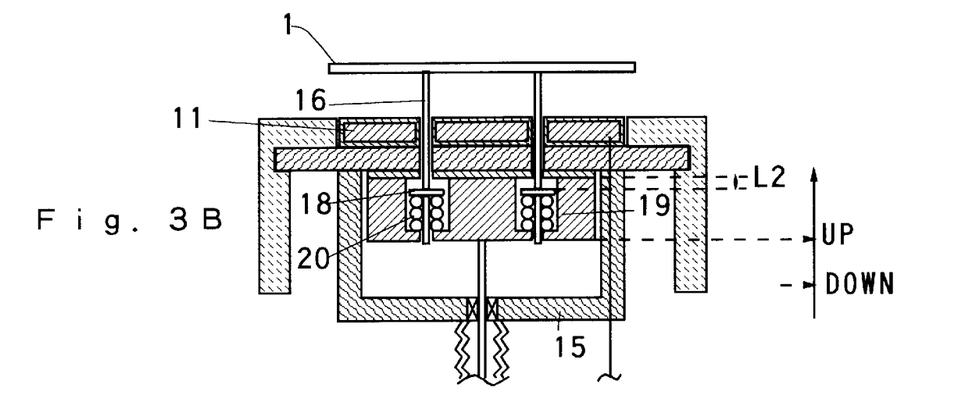
Figure 3C:
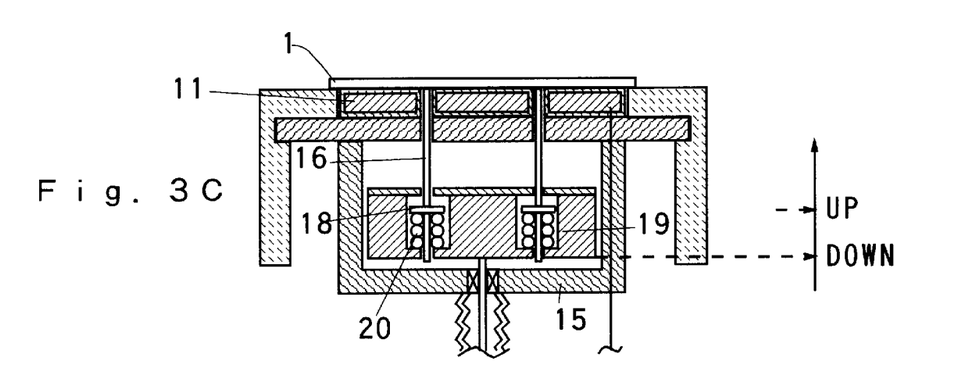

In FIGS. 3A–3C, the ejector pins 16 have their vertical position defined in terms of the position of the bottom surface of the ejector pin housing 19 as a reference position. The ejector pins 16 take the high position and low position when the reference position is at positions UP and DOWN, respectively.

The DOWN position is determined as follows. In the absence of a wafer on the ejector pins 16, they are assumed to come out their tips over the upper surface of the electrostatic chuck 11 by a length of L1. When a wafer 1 is placed on the ejector pins 16, the springs 20 are assumed to be compressed by a length of L2. The DOWN position is determined such that L1 is smaller than L2. In this embodiment, L1 and L2 are set to be 0.5 mm and 1.0 mm, respectively.

The method of operations of moving, clamping, plasma-processing, and releasing a wafer will be explained with reference to FIG. 2 and FIGS. 3A–3C.

(1) In the standby state, the ejector pin housing 19 has its bottom surface located at the DOWN position. The ejector pins 16 come out their tips over the electrostatic chuck 11 by L1 as shown in FIG. 3A.

(2) A wafer 1 is moved by the transfer arm (not shown) to the position over the electrostatic chuck 11. The ejector pin housing 19 is raised until the bottom surface comes to the UP position, and the wafer 1 is lifted by the ejector pins 16. The transfer arm retreats, and the wafer 1 is supported by the ejector pins 16, with the springs 20 being compressed by L2 by being loaded with the wafer 1 as shown in FIG. 3B.

(3) The ejector pin housing 19 is lowered to the DOWN position. The ejector pins 16 come down, and the wafer 1 is placed on the electrostatic chuck 11 as shown in FIG. 3C. During the descending of the ejector pins, the switch 26 is turned on to apply the DC voltage to the electrode 12. The ejector pins 16 are in advance grounded by turning on the switch 30, and A charge is supplied to the wafer 1 through the ejector pins 16. Consequently, the wafer 1 is clamped by the electrostatic chuck 11 based on the Coulomb force. Since L1 is set smaller than L2, all ejector pins 16 have their tips in tight contact with the rear surface of the wafer 1 by the expanding springs 20 as shown in FIG. 3C.

(4) Processing gas is introduced into the reaction chamber 51. The switch 30 is turned off to disconnect the ejector pins 16 from the ground. The switch 28 is turned on to apply the RF power from the RF power source 29 to the lower electrode 12. Plasma is generated, and the wafer 1 is processed by the plasma. After a prescribed processing time, the RF power application is stopped, and the plasma processing terminates.

(5) For releasing the wafer 1, the switch 26 is turned off to cease the DC voltage application to the electrode 12, and the switch 30 is turned on to ground the ejector pins 16. An accumulated charge is eliminated from the wafer 1 through the ejector pins 16, and the electrostatic chuck has its clamping force lost.

(6) The ejector pin housing 19 is raised to the UP position, and the wafer 1 is lifted off the electrostatic chuck 11 by the ejector pins 16 as shown in FIG. 3B.

(7) The transfer arm (not shown) is operated to take the wafer 1 out of the reaction chamber 51. The ejector pin housing 19 is lowered to the DOWN position, and the ejector pins 16 come down. The standby state, in which the ejector pins 16 come out their tips over the electrostatic chuck 11 by L1, is restored as shown in FIG. 3A.

These operations are repeated to process the wafer continuously.

Based on this embodiment, in which the ejector pin drive means can allow 0.5 mm (L1) for its control accuracy based on 1.0 mm (L2) of the compression length of the springs when loaded with a wafer, it was confirmed that the ejector pins can be brought to tight contact with the wafer rear surface. The mechanism of this embodiment facilitates the positioning control of the ejector pins, speeds up the clamping and releasing of a wafer, and suppresses the occurrence of discharge in the gap between an ejector pin and the wafer rear surface.

Next, a method of bringing the ejector pins to tight contact with the wafer rear surface at clamping and releasing a wafer and a method of controlling the clearance between the ejector pins and wafer rear surface within a prescribed range during the plasma processing (the second method of operation of the electrostatic chuck during the plasma processing mentioned previously) will be explained with reference to FIG. 2 and FIGS. 4A–4D.

In FIGS. 4A–4D, the ejector pins 16 have another vertical position DOWN2 defined, in addition to the UP and DOWN positions in the preceding embodiment. The DOWN2 position is below the DOWN position encountered when the ejector pin housing 19 is further lowered, and it is determined such that discharge does not occur in the gap L3 between an ejector pin 16 and the wafer rear surface in a state of expansion of all springs 20. In this embodiment, L1, L2 and L3 are set to be 0.5 mm, 1.0 mm and 0.5 mm, respectively.

The method of operations of moving, clamping, plasma-processing, and releasing a wafer will be explained with reference to FIG. 2 and FIGS. 4A–4D. This embodiment differs from the preceding embodiment only in the plasma processing.

Figure 4A:
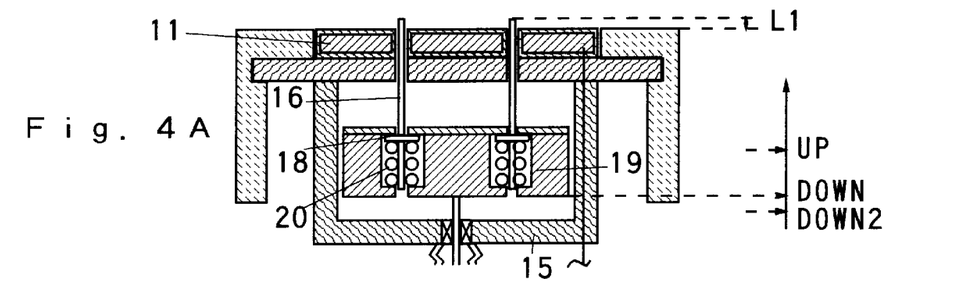
FIGS. 4A,4B,4C and 4D are longitudinal cross-sectional diagrams used to explain another method of operation of the electrostatic chuck of this invention.

(1) In the standby state, the ejector pin housing 19 has its bottom surface located at the DOWN position. The ejector pins 16 come out their tips over the electrostatic chuck 11 by L1 as shown in FIG. 4A.

Figure 4B:
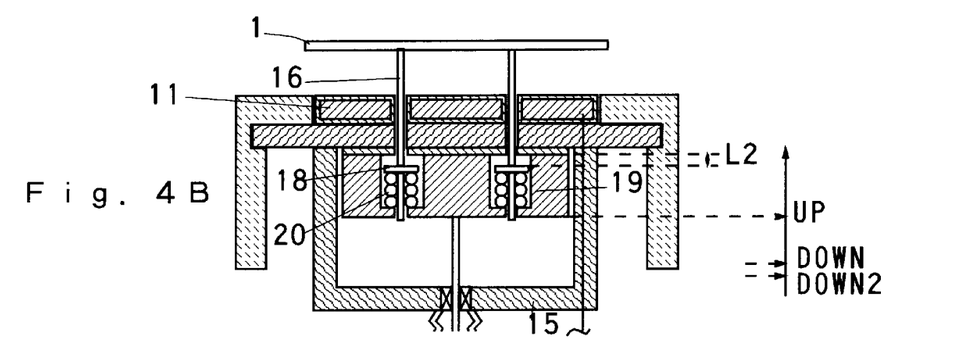

(2) A wafer 1 is moved by the transfer arm (not shown) to the position over the electrostatic chuck 11. The ejector pin housing 19 is raised until the bottom surface comes to the UP position, and the wafer 1 is lifted by the ejector pins 16. The transfer arm retreats, and the wafer 1 is supported by the ejector pins 16, with the springs 20 being compressed by L2 by being loaded with the wafer 1 as shown in FIG. 4B.

Figure 4C:
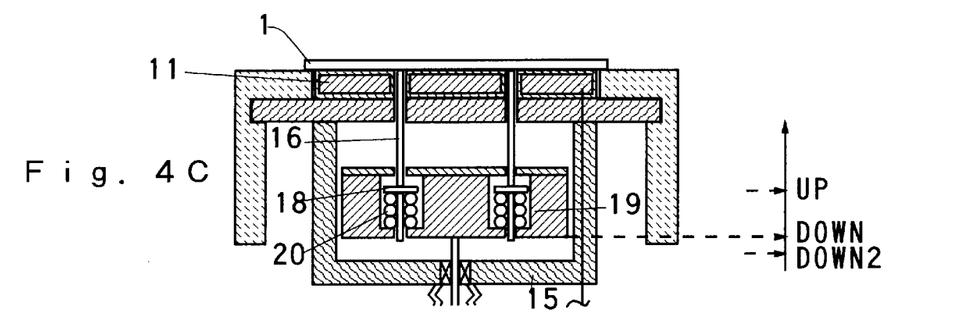

(3) The ejector pin housing 19 is lowered to the DOWN position. The ejector pins 16 come down, and the wafer 1 is placed on the electrostatic chuck 11 as shown in FIG. 4C. During the descending of the ejector pins, the switch 26 is turned on to apply the DC voltage to the electrode 12. The ejector pins 16 are in advance grounded by turning on the switch 30, and A charge is supplied to the wafer 1 through the ejector pins 16. Consequently, the wafer 1 is clamped by the electrostatic chuck 11 based on the Coulomb force. Since L1 is set smaller than L2, all ejector pins 16 have their tips in tight contact with the rear surface of the wafer 1 by the expanding springs 20 as shown in FIG. 4C.

Figure 4D:
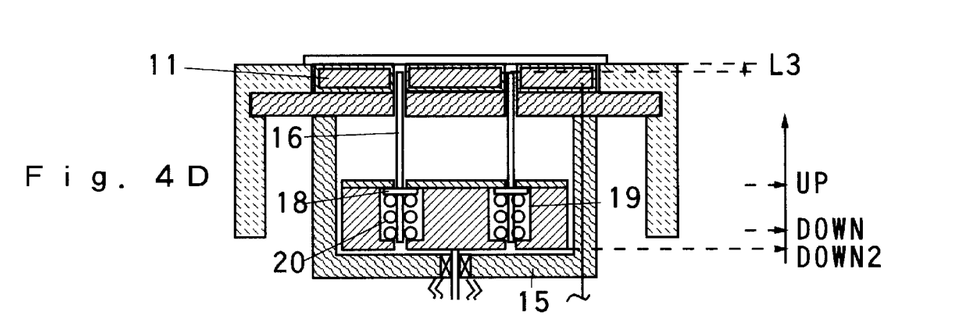

(4) Processing gas is introduced into the reaction chamber 51. The ejector pin housing 19 is lowered to the DOWN2 position. Then, the ejector pins 16 further come down, creating a clearance of L3 from the wafer rear surface as shown in FIG. 4D.

(5) The switch 30 is turned off to disconnect the ejector pins 16 from the ground. The switch 28 is turned on to apply the RF power from the RF power source 29 to the lower electrode 12. Plasma is generated, and the wafer 1 is processed by the plasma. After a prescribed processing time, the RF power application is stopped, and the plasma processing terminates.

(6) For releasing the wafer 1, the switch 26 is turned off to cease the DC voltage application to the electrode 12, and the ejector pin housing 19 is raised to the DOWN position. Then, the ejector pins 16 go up to come in contact with the wafer rear surface as shown in FIG. 4C. The switch 30 is turned on to ground the ejector pins 16. An accumulated charge is eliminated from the wafer 1 through the ejector pins 16, and the electrostatic chuck has its clamping force lost.

(7) The ejector pin housing 19 is raised to the UP position, and the wafer 1 is lifted off the electrostatic chuck 11 by the ejector pins 16 as shown in FIG. 4B.

(8) The transfer arm (not shown) is operated to take the wafer 1 out of the reaction chamber 51. The ejector pin housing 19 is lowered to the DOWN position, and the ejector pins 16 come down. The standby state, in which the ejector pins 16 come out their tips over the electrostatic chuck 11 by L1, is restored as shown in FIG. 4A.

These operations are repeated to process the wafer continuously.

Based on this embodiment, it was confirmed that the occurrence of discharge in the gap between an ejector pin and the wafer rear surface can be suppressed by maintaining a clearance of 0.6 mm or less between the ejector pins and wafer rear surface during the plasma processing.

The charge-up damage were evaluated for the method of operation of keeping the ejector pin tip in tight contact with the wafer rear surface during the plasma processing and the method of operation of allowing a clearance of 0.5 mm for the ejector pin tip from wafer rear surface during the plasma processing.

Figure 5:
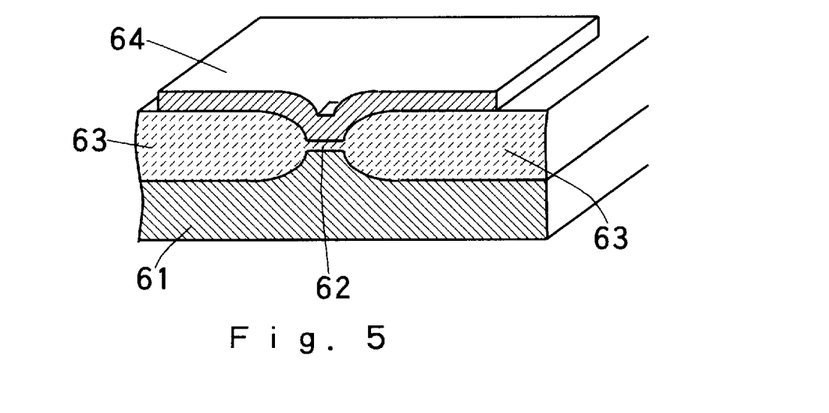
FIG. 5 is a diagram showing an antenna MOS element used for the evaluation of charge-up damage.

An antenna MOS (Metal Oxide Semiconductor) element shown in FIG. 5 was used for the evaluation of charge-up damage. It consists of a p-type silicon wafer 61, a gate insulator film 62 of silicon oxide ($SiO_2$), a field oxide film 63 of thermal silicon oxide ($SiO_2$), and a gate electrode of poly-silicon 64. The antenna ratio is $64 \times 10^4$, and the gate insulator film has a thickness of 8 nm.

Silicon oxide films ($SiO_2$) were formed on wafers, with the antenna MOS elements being formed, and the silicon oxide films were etched back in the plasma processing apparatus equipped with the electrostatic chuck shown in FIG. 2, thereby evaluating the yield of antenna MOS elements that survived the dielectric breakdown.

The silicon oxide film was formed to have a thickness of 250 nm based on the LPCVD process. The conditions of etchback were as follows. Ar: 400 sccm, $CF_4$: 20 sccm, $CHF_3$: 30 sccm, pressure: 250 mTorr, frequency of RF voltage: 13.56 MHz, RF power: 800 W, spacing of electrode: 11 mm.

Figure 6:
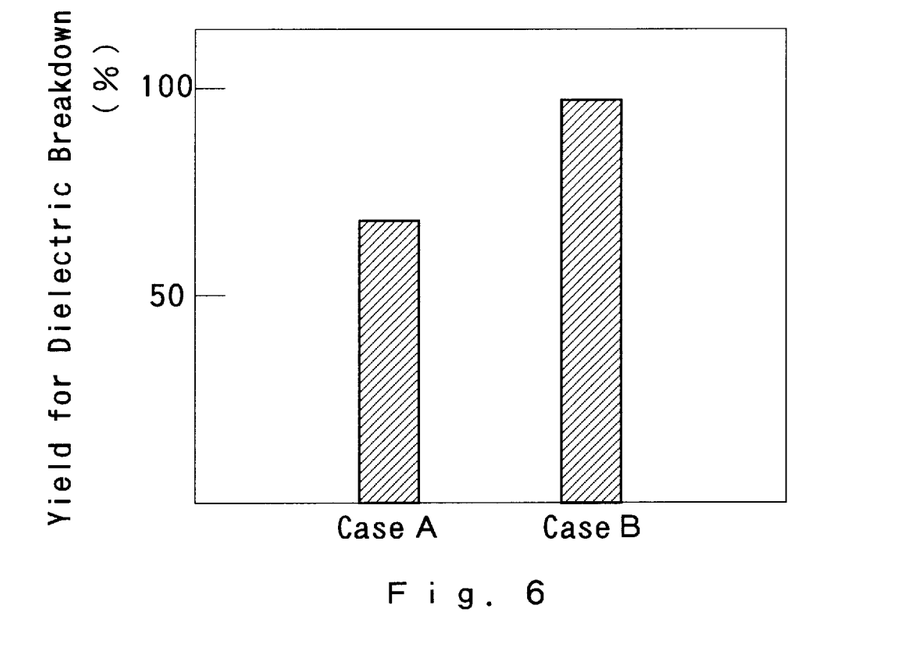
FIG. 6 is a graph showing the yield of antenna MOS elements that survived the dielectric breakdown.

FIG. 6 shows the result of the yield of antenna MOS elements that survived the dielectric breakdown. Case A is of the condition of etch-back in which the ejector pin tip is brought to contact with the wafer rear surface, and case B is of the condition of etch-back in which a clearance of 0.5 mm is allowed for the ejector pin tip from the wafer rear surface.

The graph reveals the improvement by case B of the yield of antenna MOS elements. It was confirmed that the chargeup damage to the insulator film can be reduced by allowing a clearance of 0.5 mm for the ejector pin from the wafer rear surface during the plasma processing.

Although in the foregoing embodiments, A charge is supplied to and eliminated from the wafer through the ejector pins at both clamping and releasing of the wafer, it is obvious that charge supply and elimination operations may be assisted by the exposure of inert gas plasma such as Ar gas plasma.

As described above in detail, the electrostatic chuck of this invention facilitates the positioning control of the ejector pins and enables the ejector pins to come in tight contact with the wafer rear surface, and consequently a wafer can be clamped and released quickly and reliably.

At the plasma processing of wafer, the ejector pins are brought to tight contact with the wafer rear surface, thereby suppressing the occurrence of discharge in the gap between an ejector pin and the wafer rear surface, and the problems associated with this discharge can be dissolved.

At the plasma processing of wafer, a clearance within a prescribed range is created for the ejector pins from the wafer rear surface, thereby suppressing the occurrence of discharge in the gap between an ejector pin and the wafer rear surface, and charge-up damage to the wafer can be reduced.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An electrostatic chuck comprising:
   a plurality of ejector pins;
   means of moving up and down said ejector pins;
   means of electrically grounding said ejector pins; and
   an ejector buffer mechanism disposed between said ejector pins and said ejector pin moving means for exerting a buffer action moving the tip positions of individual ejector pins independently, relatively, to one another throughout a range of movement for each pin that ensures all of said plurality of pins contact the rear surface of a workpiece held by said chuck.

2. An electrostatic chuck according to claim 1, wherein said ejector buffer mechanism comprises springs.

3. A method of operating an electrostatic chuck, wherein at plasma processing for a workpiece, all ejector pins are disconnected from the ground, and said ejector pins are positioned to have a clearance within a certain range from the rear surface of said workpiece so that a discharge does not occur in the gap between an ejector pin and the rear surface of said workpiece.

4. A method of operating an electrostatic chuck according to claim 3, wherein said range of clearance of said ejector pins from the rear surface of said workpiece is within 0.6 mm.

5. In an electrostatic chuck comprised of a plurality of ejector pins, means for moving up and down said ejector pins, means for electrically grounding said ejector pins, and an ejector buffer mechanism disposed between said ejector pins and said ejector pin moving means for exerting a buffer action moving the tip positions of individual ejector pins independently, relatively, to one another throughout a range of movement for each pin that ensures all of said plurality of pins contact the rear surface of a workpiece held by said chuck, a method of operating said electrostatic chuck wherein at clamping or releasing of a workpiece, all said ejector pins are brought into contact with the rear surface of said workpiece.

6. In an electrostatic chuck comprised of a plurality of ejector pins, means for moving up and down said ejector pins, means for electrically grounding said ejector pins, and an ejector buffer mechanism disposed between said ejector pins and said ejector pin moving means for exerting a buffer action moving the tip positions of individual ejector pins independently, relatively, to one another throughout a range of movement for each pin that ensures all of said plurality of pins contact the rear surface of a workpiece held by said chuck, a method of operating said electrostatic chuck; wherein at plasma processing of a workpiece, all ejector pins are disconnected from the ground, and all said ejector pins are brought into contact with the rear surface of said workpiece.

7. A method of operating the electrostatic chuck according to claim 6, wherein said range of clearance of the ejector pins from and the rear surface of said workpiece is within 0.6 mm.

8. In an electrostatic chuck comprised of a plurality of ejector pins, means for moving up and down said ejector pins, means for electrically grounding said ejector pins, and an ejector buffer mechanism disposed between said ejector pins and said ejector pin moving means for exerting a buffer action moving the tip positions of individual ejector pins independently, relatively, to one another throughout a range of movement for each pin that ensures all of said plurality of pins contact the rear surface of a workpiece held by said chuck, a method of operating said electrostatic chuck wherein at plasma processing of a workpiece all ejector pins are disconnected from the ground and said ejector pins are positioned to have a clearance within a certain range from the rear surface of said workpiece so that a discharge does not occur in the gap between said ejector pins and said rear surface of the workpiece.

9. An electrostatic chuck comprising:

a workpiece supporting surface;

a plurality of ejector pins;

means of moving up and down said ejector pins;

means of electrically grounding said ejector pins; and an ejector buffer mechanism disposed between said ejector pins and said ejector pin moving means so that, when the ejector pins are in a clamping or releasing position, the tips of the individual ejector pins project over said workpiece supporting surface in the absence of a workpiece and contact the rear surface of a workpiece placed on said workpiece supporting surface.

* * * * *

UNITED STATES PATENT AND TRADEMARK OFFICE
CERTIFICATE OF CORRECTION

PATENT NO.  : 5,815,366
DATED       : September 29, 1998
INVENTOR(S) : Yoshihisa Morita et al.

It is certified that error appears in the above-indentified patent and that said Letters Patent is hereby corrected as shown below:

Column 9, line 20, change "claim 6," to "claim 8,"

Signed and Sealed this

Ninth Day of March, 1999

Attest:

Q. TODD DICKINSON

*Attesting Officer*    *Acting Commissioner of Patents and Trademarks*